(12) United States Patent
Wei

(10) Patent No.: US 9,175,381 B2
(45) Date of Patent: Nov. 3, 2015

(54) PROCESSING TUBULAR SURFACES USING DOUBLE GLOW DISCHARGE

(75) Inventor: Ronghua Wei, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 1025 days.

(21) Appl. No.: 12/169,837

(22) Filed: Jul. 9, 2008

(65) Prior Publication Data

US 2010/0006421 A1 Jan. 14, 2010

(51) Int. Cl.
*C23C 14/34* (2006.01)
*C23C 14/16* (2006.01)
*C23C 14/54* (2006.01)
*C23C 14/48* (2006.01)
*C23C 14/04* (2006.01)

(52) U.S. Cl.
CPC ............. *C23C 14/345* (2013.01); *C23C 14/046* (2013.01); *C23C 14/16* (2013.01); *C23C 14/165* (2013.01); *C23C 14/48* (2013.01); *C23C 14/541* (2013.01)

(58) Field of Classification Search
CPC ............ C23C 14/541; C23C 14/3407; C23C 14/3492; C23C 14/48; C23C 14/16
USPC ........................................ 204/298.21, 192.12
See application file for complete search history.

(56) References Cited

U.S. PATENT DOCUMENTS

| | | | |
|---|---|---|---|
| 4,374,722 A * | 2/1983 | Zega | 204/298.03 |
| 4,377,773 A | 3/1983 | Hershcovitch et al. | |
| 4,407,712 A | 10/1983 | Henshaw et al. | |
| 4,520,268 A | 5/1985 | Xu | |
| 4,680,197 A * | 7/1987 | Sagoi et al. | 427/129 |
| 4,731,539 A | 3/1988 | Xu | |
| 4,764,394 A | 8/1988 | Conrad | |
| 4,795,942 A | 1/1989 | Yamasaki | |
| 5,249,554 A | 10/1993 | Tamor et al. | |
| 5,458,927 A | 10/1995 | Malaczynski et al. | |
| 5,483,121 A | 1/1996 | Okagaki et al. | |
| 5,593,798 A | 1/1997 | Muller et al. | |

(Continued)

FOREIGN PATENT DOCUMENTS

| JP | 63 026373 A | 2/1988 |
|---|---|---|
| JP | 02205666 A * | 8/1990 |
| JP | 02243766 | 9/1990 |

OTHER PUBLICATIONS

Chen, et al., "Development and Characterization of Micromachined Hollow Cathode Plasma Display Devices," Journal of Microelectromechanical Systems, vol. 11, No. 5, Oct. 2002. pp. 536-543.

(Continued)

*Primary Examiner* — Jason M Berman
(74) *Attorney, Agent, or Firm* — Grossman, Tucker et al

(57) ABSTRACT

A method of sputtering a component includes positioning a conductive substrate into a vacuum chamber, wherein the conductive substrate is tubular and has a surface. A source electrode including a source material may be inserted into the conductive substrate. A first bias voltage $\Delta V_{ac1}$ may be applied between the conductive substrate and the vacuum chamber and a second bias voltage $\Delta V_{as1}$ may be applied between the source electrode and the vacuum chamber, sputtering the source material onto the conductive substrate.

18 Claims, 7 Drawing Sheets

(56) References Cited

U.S. PATENT DOCUMENTS

| | | | |
|---|---|---|---|
| 5,605,714 | A | 2/1997 | Dearnaley et al. |
| 5,725,573 | A | 3/1998 | Dearnaley et al. |
| 6,055,928 | A | 5/2000 | Murzin et al. |
| 6,087,025 | A | 7/2000 | Dearnaley et al. |
| 6,120,660 | A | 9/2000 | Chu et al. |
| 6,182,604 | B1* | 2/2001 | Goeckner et al. ......... 118/723 E |
| 6,410,144 | B2 | 6/2002 | Dearnaley et al. |
| 6,497,803 | B2* | 12/2002 | Glocker et al. .......... 204/298.21 |
| 6,514,565 | B2 | 2/2003 | Dearnaley et al. |
| 6,524,538 | B2 | 2/2003 | Barankova et al. |
| 6,572,933 | B1 | 6/2003 | Nastasi et al. |
| 6,632,482 | B1 | 10/2003 | Sheng |
| 6,767,436 | B2 | 7/2004 | Wei et al. |
| 6,878,404 | B2 | 4/2005 | Verrasamy et al. |
| 6,893,907 | B2 | 5/2005 | Maydan et al. |
| 7,052,736 | B2 | 5/2006 | Wei et al. |
| 7,094,670 | B2 | 8/2006 | Collins et al. |
| 7,300,684 | B2 | 11/2007 | Boardman et al. |
| 8,029,875 | B2 | 10/2011 | Wei et al. |
| 8,753,725 | B2 | 6/2014 | Wei et al. |
| 2001/0009225 | A1* | 7/2001 | Leyendecker et al. ... 204/298.08 |
| 2004/0025454 | A1 | 2/2004 | Burgess |
| 2004/0055870 | A1 | 3/2004 | Wei |
| 2004/0084152 | A1 | 5/2004 | Gregoire et al. |
| 2004/0254545 | A1 | 12/2004 | Rider, II et al. |
| 2005/0061251 | A1 | 3/2005 | Wei et al. |
| 2005/0287307 | A1 | 12/2005 | Singh et al. |
| 2006/0011468 | A1 | 1/2006 | Boardman et al. |
| 2006/0076231 | A1 | 4/2006 | Wei |
| 2006/0076235 | A1 | 4/2006 | Wei |
| 2006/0121704 | A1 | 6/2006 | Walther et al. |
| 2006/0196419 | A1 | 9/2006 | Tudhope et al. |
| 2006/0198965 | A1 | 9/2006 | Tudhope et al. |
| 2006/0251917 | A1* | 11/2006 | Chiang et al. ................. 428/674 |
| 2006/0264060 | A1 | 11/2006 | Ramaswamy et al. |
| 2008/0292806 | A1 | 11/2008 | Wei et al. |
| 2009/0120367 | A1 | 5/2009 | Porshnev et al. |
| 2009/0176035 | A1 | 7/2009 | Tudhope et al. |
| 2011/0111132 | A1 | 5/2011 | Wei et al. |
| 2011/0151141 | A1 | 6/2011 | Upadhyaya et al. |
| 2012/0045592 | A1 | 2/2012 | Kumar et al. |
| 2012/0231177 | A1 | 9/2012 | Wei et al. |

OTHER PUBLICATIONS

Anders, "From Plasma Immersion Ion Implantation to Deposition: A Historical Perspective on Principles and Trends," Surface and Coatings Technology, vol. 156, Issues 1-3, Jul. 1, 2002, pp. 3-12.

Kostov, et al., "Two Dimensional Computer Simulation of Plasma Immersion Ion Implantation," Brazilian Journal of Physics, vol. 34, No. 4B, Dec. 2004.

"Plasma-enhanced Chemical Vapor Deposition," available at http://en.wikipedia.org/wiki/Plasma-enhanced_chemical_vapor_deposition, retrieved on May 18, 2007, 3 pages.

"Diamond-like Carbon," available at http://en.wikipedia.org/wiki/Diamond-like_carbon, retrieved on May 16, 2007, 6 pages.

Apetrei, et al., "Characterization of a Modified Hollow-cathode Discharge Plasma by Optical Means," 32nd EPS Conference of Plasma Phys. Tarragona, Jun. 27-Jul. 1, 2005 ECA vol. 29C, P-4.139 (2205), 4 pages.

Shader, et al., "Hollow Cathode Lamps—Yesterday, Today and Tomorrow," Mar. 1999, available at https://www.varianinc.com/media/sci/apps/a-aa14.pdf, retrieved on May 15, 2008, 7 pages.

"Plasma Immersion Ion Implantation (PI3)—The Technology, Applications and Success to Date," Materials Australia, vol. 34, No. 1, p. 9, Jan./Feb. 2002, available at http://www.azom.com/details.asp?ArticleID=2090, retrieved on May 16, 2007, 3 pages.

"Plasma Immersion Ion Processing," 18-Steam Turbine Technology Brochure, available at http://www.swri.org/3pubs/brochure/d18/plasma/plasma.htm, retrieved on May 16, 2007, 2 pages.

"Hollow Cathodes," available at http://www.engr.colostate.edu/ionstand/research_hollowcathods.html, retrieved on May 17, 2007, 3 pages.

"Hollow Cathode Plasma Source," available at http://www.vtd.de/en/produkte/komponenten/ko_ref2.php, retrieved on May 17, 2007, 1 page.

"Cold War Against Hydrates," available at http://www.ntnu.no/gemini/2003-06e/28-31.htm. retrieved on May 16, 2007, 5 pages.

Wei, "A novel High-Intensity Metal Ion Source for Plasma Immersion Implantation and Deposition (MPIII&D) 18-9292," available at http://www.swri.org/3pubs/IRD2003/Synopses/189292.htm, retrieved on May 16, 2007, 2 pages.

"SwRI Surface Modification Facility Offers Two New Capabilities," available at http://www.swri.org/9what/releases/2000/PIIP.htm, retrieved on May 16, 2007, 2 pages.

Monaghan, et al. "Diamond-Like Carbon Coatings," Materials World, vol. 1 No. 6 pp. 347-349, Jun. 1993, available at http://www.azom.com/details.asp?ArticleID=623, retrieved on May 16, 2007.

International Search Report and Written Opinion dated Aug. 26, 2008 issued in related International Patent Application No. PCT/US08/64344.

U.S. Office Action dated May 25, 2010 issued in related U.S. Appl. No. 11/752,787.

U.S. Office Action dated Sep. 15, 2009 issued in related U.S. Appl. No. 11/752,787.

Zizka, "Plasma deposition of thin metal layers in the discharge with a hollow target". Czech. J. Phys. B 33 (1983), pp. 14-24.

Tian, et al., "Theoretical investigation of plasma immersion ion implantation of cylindrical bore using hollow cathode plasma discharge". Surface and Coatings Technology 203 (2009) pp. 2727-2730.

Wei, et al., "Magnetic field enhanced plasma (MFEP) deposition of inner surfaces of tubes". Surface and Coatings Technology 188-189 (2004) pp. 691-696.

Xu, et al. "Double glow plasma surface alloying and plasma nitride," Surface and Coating Technology vol. 201, Issue 9-11, Feb. 2007, pp. 4822-4825 (abstract enclosed).

Hosokawa, et al., "Self-sputtering phenomena in high-rate coaxial cylindrical magnetron sputtering," J. Vac. Sci. Technol., vol. 14, No. 1, Jan./Feb. 1997. pp. 143-146.

Examiner's Report dated Dec. 7, 2011 issued in related Australian Patent Application No. 2008256944.

Search Report dated Jul. 5, 2012 issued in related European Patent Application No. 08756039.7 (8 pgs).

T.Casserly, et al; "Investigation of DLC-Si Film Deposited Inside a 304SS Pipe Using a Novel Hollow Cathode Plasma Immersion Ion Processing Method"; 2007 Society of Vacuum Coaters 505/865-7188; 50th Annual Technical Conference Proceedings (2007) ISSN 0737-5921; pp. 59-62.

Office Action dated Sep. 2, 2013 issued in related European Patent Application No. 08 756 039.7 (4 pgs).

Non-Final Office Action dated Sep. 25, 2013 issued in related U.S. Appl. No. 13/046,181 (12 pgs).

Lusk, et al, "A High Density Hollow Cathode Plasma PECVD Technique for Depositing Films on the Internal Surfaces of Cylindrical Substrates", Wiley InterScience, Plasma Processes and Polymers, 2009, 6, S429-S432.

Lusk, et al, "A Hollow Cathode High Density Plasma Process for Internally Coating Cylindrical Substrates", [US Office Action dated Sep. 25, 2013 (U.S. Appl. No. 13/046,181)].

* cited by examiner

PROCESSING TUBULAR SURFACES USING DOUBLE GLOW DISCHARGE

FIELD OF THE INVENTION

The present disclosure relates to the diffusion and/or deposition of metallic and/or ceramic coatings onto a tubular surface using double glow discharge.

BACKGROUND

There are a number of applications where it may be desirable to provide corrosion, erosion or wear protection in tubular structures that may transmit fluids, gasses or other materials. While a number of techniques may be used to coat interior surfaces, including painting, electroplating, plasma spray or cladding, plasma enhanced chemical vapor deposition by plasma immersion ion deposition, or cylindrical magnetron sputter deposition, it may be difficult to coat the inner diameter of a tube, particularly when the tube is curved. In addition, the coatings may not be sufficient to meet technical requirements. In particular, while plasma enhanced chemical deposition may be used to provide coatings for curved tubes, the resulting diamond like carbon films produced typically include pin holes and the deposition of pure metallic film may be difficult. Furthermore, cylindrical magnetron sputter deposition has not been found to accommodate small diameter tubing and is not applicable to curved tubes.

SUMMARY OF THE INVENTION

An aspect of the present disclosure relates to a method of sputtering a component. The method may include positioning a conductive substrate into a vacuum chamber, wherein the conductive substrate is tubular and has a surface. A source electrode including a source material may be inserted into the conductive substrate. A first bias voltage $\Delta V_{ac1}$ may be applied between the conductive substrate and the vacuum chamber and a second bias voltage $\Delta V_{as1}$ may be applied between the source electrode and the vacuum chamber, sputtering the source material onto the conductive substrate.

Another aspect of the present disclosure relates to a method of sputtering a component. The method may include positioning a conductive substrate into a vacuum chamber, wherein the conductive substrate is tubular and has a surface. A source electrode including a source material may be inserted into the conductive substrate. A first bias voltage $\Delta V_{ac1}$ may be applied between the conductive substrate and the vacuum chamber and a second bias voltage $\Delta V_{as1}$ may be applied between the source electrode and the vacuum chamber; and the source material may be sputtered onto the conductive substrate. The source material may be coated onto the conductive substrate at a thickness of up to and including 250 µm and/or the source material may diffuse up to and including 250 µm from the surface of the conductive substrate.

A further aspect of the present disclosure may relate to a method of sputtering a component. The method may include positioning a source electrode including a source material into a vacuum chamber. A conductive substrate may be inserted into the source electrode, wherein the source material is tubular. A first bias voltage $\Delta V_{ac1}$ may be applied between the conductive substrate and the vacuum chamber and a second bias voltage $\Delta V_{as1}$ may be applied between the source electrode and the vacuum chamber, sputtering the source material onto the conductive substrate.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

The present disclosure relates to a method and system for the diffusion and/or deposition of metallic and/or ceramic coatings onto an inner diameter of a tubular substrate using double glow discharge. Double glow discharge may be understood herein as a sputter coating or diffusion process wherein solid alloying elements or metals are introduced to or into the surfaces of electrically conductive substrates. The process may utilize an anode, which may include the vacuum chamber itself or a surface within the vacuum chamber, a cathode including the substrate to be treated and a source electrode including the alloying elements or metals to be introduced to the substrate surface. During double glow discharge, the substrate may be heat treated, diffused and/or coated with metallic and/or ceramic materials. In particular, the substrate may be treated with a pure metallic element, (i.e., the deposited metal may include less than 5% of impurities), such as Ti, Cr or TiN.

Figure 1:
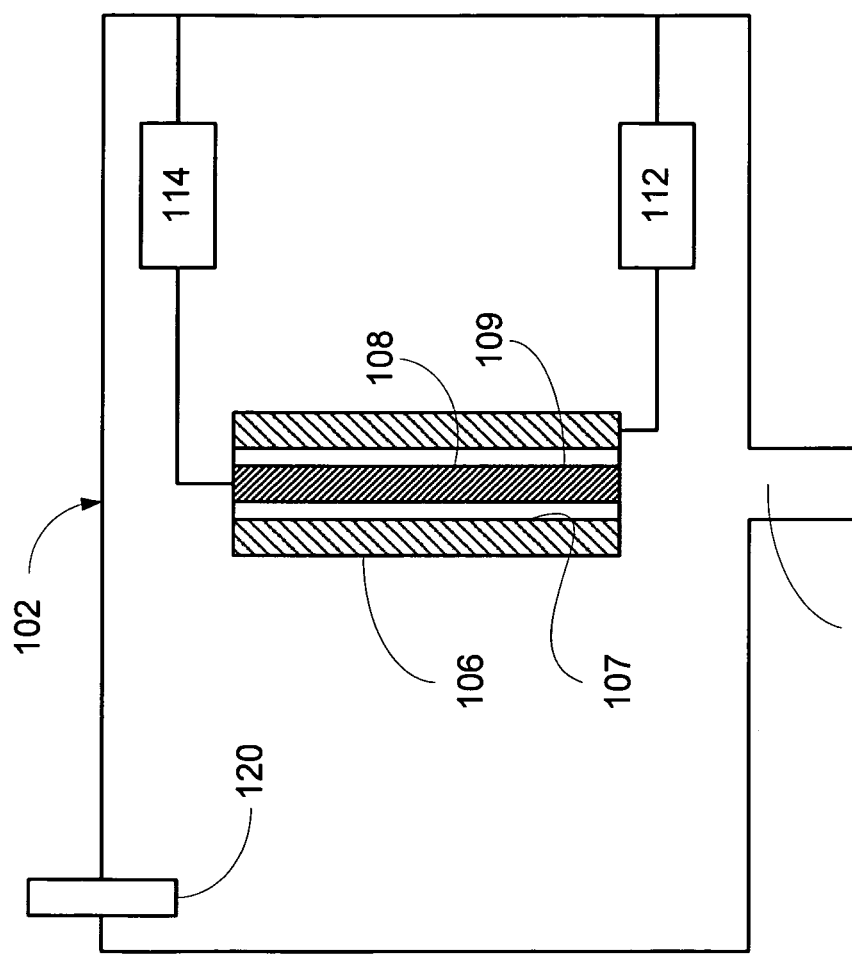
FIG. 1 is a schematic of an example of a system contemplated herein.

FIG. 1 illustrates an example of a system for diffusing and/or coating the inside of a tube. The system may include a vacuum chamber 102, which may include a vacuum pump outlet 104 in communication with a vacuum pump. In addition, one or more gasses may be provided to the vacuum chamber 102 through one or more gas supply 120 inlets in communication with one or more gas sources. A pressure control valve may be used as well to adjust the pressure within the chamber. The vacuum chamber may be set up as an anode, having a power supply attached thereto.

Figure 2:
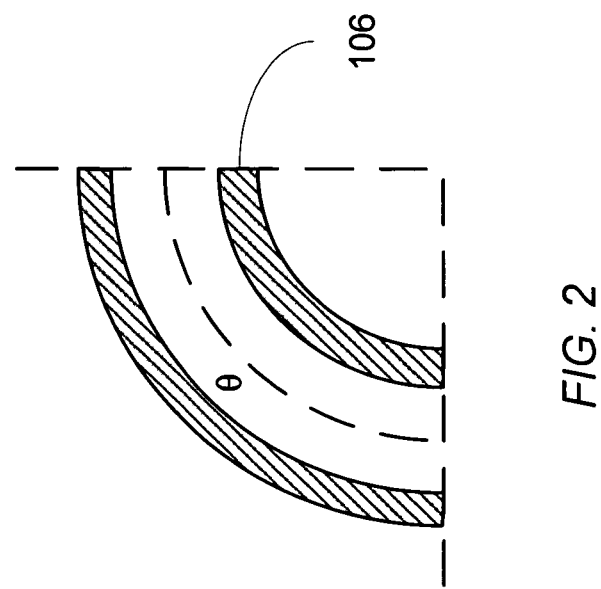
FIG. 2 is a schematic of an example of a curved tube.
Figure 3:
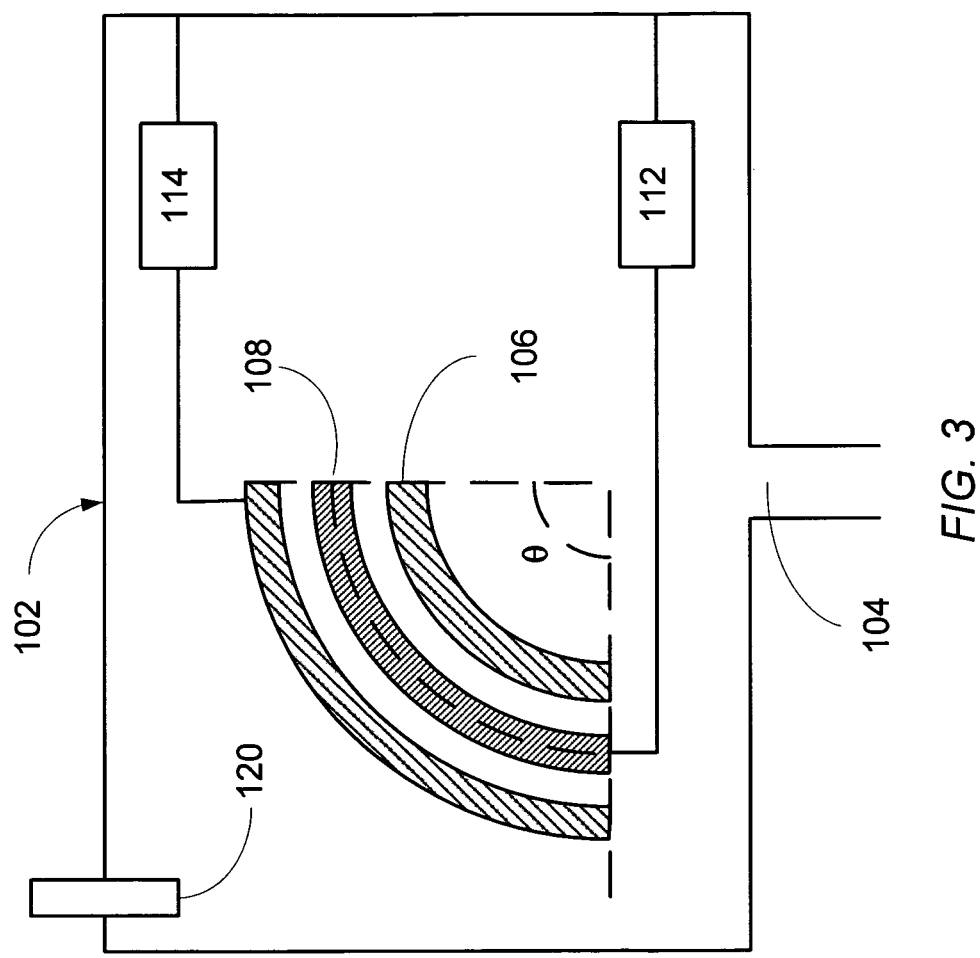
FIG. 3 is a schematic of an example of a system contemplated herein.
Figure 4:
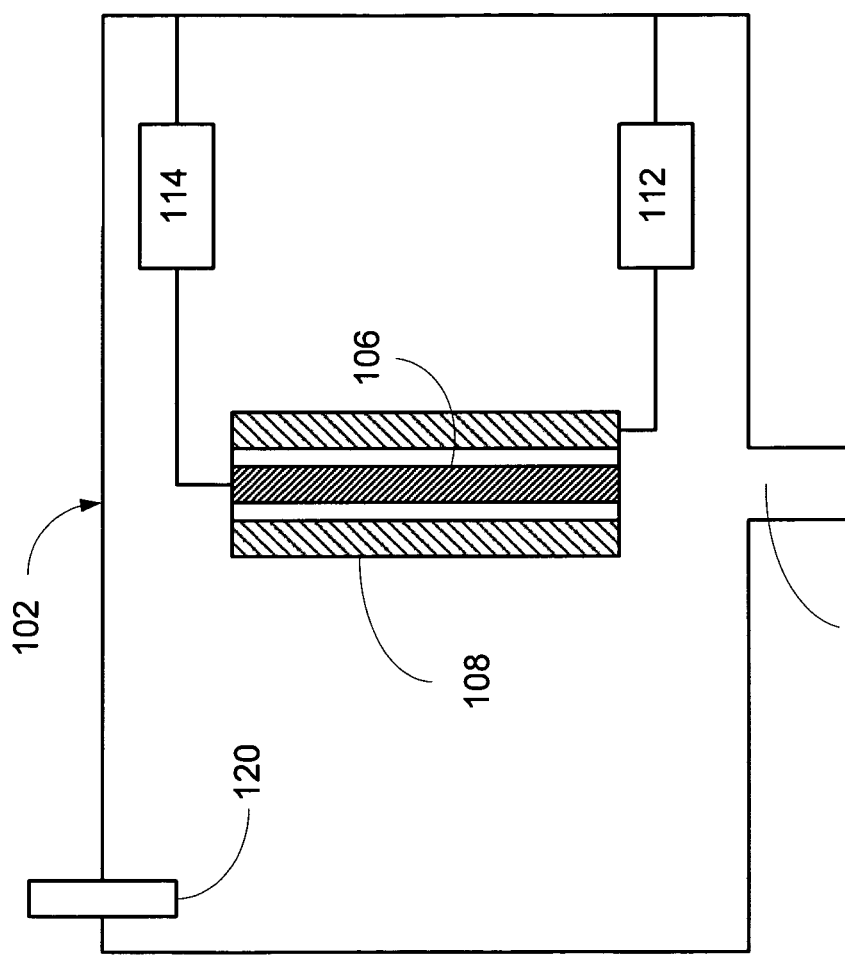
FIG. 4 is another schematic of an example of a system contemplated herein.

Inside the chamber a first electrode or cathode may be arranged within. The first electrode may include a hollow, tubular substrate 106. The substrate, which may be the cathode, may be a conductive material. Such conductive material may include metals, metal alloys, conductive polymers, conductive ceramics or combinations thereof. The substrate to be treated may be tubular, i.e., define a hollow interior, and may exhibit any given cross-section(s) including circular, square, oval, triangular, hexagonal, octagonal, rectangular, etc. The substrate may define an internal surface 107 and have an internal diameter in the range of 1 mm to 4 m including all values and increments therein. The substrate may also be curved, as illustrated in FIG. 2, wherein the curved substrate 106 may exhibit an angle θ in the range of 0.1 to 270 degrees, including all values and increments therein, and may be introduced into the vacuum chamber as illustrated in FIG. 3. It may be appreciated that the process set up may be reversed, as illustrated in FIG. 4, wherein the substrate 106 may be positioned within a source electrode 108. Otherwise, the remainder of the process may remain relatively similar with respect to the bias voltages, timing, inert gas/chamber pressure, etc.

Referring back to FIG. 1, a second, source electrode 108 may then be positioned within the tubular substrate 106. The source electrode may define an external surface and have an external diameter 109 in the range of 0.1 mm to 3.95 m, including all values and increments therein. The source element may also be a conductive material, such as metals, metal alloys, conductive polymers, conductive ceramics or combinations thereof. Metals may include, for example, transition metals such as Ni, Ti, Cr, W, Ta, etc., the lanthanides, such as La or Ce, or poor metals, such as Al. In addition, non-metallic species may be added such as nitrogen, carbon and/or boron and other metalloids, including oxygen. The non-metallic species may be added as a gas through a gas supply inlet 120 and may or may not react with the various source materials as they are being deposited on to or into the substrate surface. In one particular embodiment, the gas may be a carbonaceous gas, which may be understood as a gas providing carbon, such as methane, ethane, propane or natural gas.

During processing, the vacuum chamber may be evacuated to a pressure of approximately $1\times10^{-4}$ torr to $1\times10^{1}$ torr, including all values and increments therein. An inert gas may be supplied to the vacuum chamber, such as argon or helium. The addition of the gas may slightly raise the pressure in the chamber to $1\times10^{-2}$ torr to $1\times10^{2}$ torr, including all values and increments therein. The surface of the substrate may be sputter cleaned via the inert gas. Once cleaned, and during coating, additional gas may be supplied and the pressure may be in the range of $1\times10^{-1}$ to $1\times10^{2}$ torr, including all values and increments therein.

A power supply 112 may be connected to the substrate 106 and the same or another power supply 114 may be connected to the source electrode 108. The power supply connected to the substrate may provide direct current. The power supply connected to the source electrode may provide direct current and/or alternating current. A first voltage differential may be applied between the first electrode, i.e., the substrate, and the anode, i.e., the vacuum chamber. The bias voltage or potential difference ($\Delta V_{ac1}$) may be in the range of 100-1000 V, including all values and increments therein. The bias voltage may cause the substrate to be bombarded with positive ions from the inert atmosphere and the temperature of the substrate to increase. A second bias voltage or potential difference ($\Delta V_{ac1}$) between the anode and substrate may be applied, where the potential difference may be increased to the range of 300-1000 V, including all values and increments therein. The second bias voltage may be applied once the substrate has been cleaned or after a given time period, such as from 1 second to 2 hours, including all values and increments therein.

Once the substrate has been cleaned, a bias voltage may also be applied between the anode (the vacuum chamber) and the source electrode, wherein the potential difference ($\Delta V_{as1}$) may be less than or equal to the first voltage differential between the anode and substrate ($\Delta V_{ac1}$). The bias or potential difference between the anode and the source electrode may be the same polarity as the bias between the anode and the substrate. Thus, one glow discharge may be present between the substrate and the vacuum chamber and a second glow discharge may be present between the vacuum chamber and the source electrode. An alternating current may also as resistance heating.

The bombardment by positive ions may cause the ejection of positive ions from the source electrode, which may be attracted to the relatively negative cathode (or substrate), having a higher or greater voltage bias than the source electrode with respect to the anode or vacuum chamber. The ions may coat and/or penetrate (diffuse) into the surface of the substrate. For example, they may diffuse into the surface up to and including 250 μm from the surface, including all values and increments in the range from 0.1 μm-250 μm. A coating may also be formed on the surface, also up to and including 250 μm, including all values and increments in the range from 0.1 μm to 250 μm. The coating formed on the surface may therefore be a layer having a thickness in the range of 0.1 μm to 250 μm, including all values and increments therein. Furthermore, both coating and/or diffusion may be provided as desired. The double glow discharge process may be applied for a few seconds to a few days, such as 2 or 3 seconds to up to 48 hours, including all values and increments therein. The atoms or ions may be implanted at a concentration of up to 20 atomic % or more, including all values and increments in the range of 1 to 30 atomic %, within 100 μm from the surface.

It may be appreciated that the substrate or the source electrode may be cooled or voltage biases may be adjusted such that temperature of the substrate or source electrode may be reduced to or maintained at or about a given set point forming a metallic coating on the surface of the sample during discharge processing, wherein the material of the source electrode (along with any reaction products to the introduction of additional gasses) may be deposited on the substrate surface. Substrate cooling may be facilitated by, for example, providing jackets around the substrate or providing cooling channels within the substrate through which a cooling media, such as water or gas may be circulated. It may be appreciated that in one example, depending on the various process parameters, i.e., gas pressure, voltage biases, etc., and temperature of the substrate and/or source electrode, the amount of diffusion of the source electrode material deposited onto the substrate may be adjusted.

Furthermore, melting of the substrate or the coating materials may not be necessary to obtain the coating or diffusion of the coating material in the substrate. That is, the source electrode material may not be melted to deposit the material onto the substrate. Thus, it may be appreciated that a refractory metal, such as W, Mo, Nb, Ta or Re, may be deposited on a relatively low temperature metal having a lower melting point than the refractory metal, without melting either metal. Accordingly, the present disclosure may avoid melting of the source electrode, and provide coating of a relatively lower melting substrate, with a relatively higher melting coating material, without substrate and/or substrate surface melting.

The deposited and diffuse coatings provided herein may be used to increase erosion or wear resistance of the tubing in various systems. Such systems may include petroleum or natural gas products where sand entrapped in fluid media may cause wear or in power generation products where water droplets contained in two phase flow tubings may affect erosion of the tubings. In addition, the coatings herein may increase corrosion resistance against various media such as water, $H_2S$, $CO_2$, $NH_3$, Cl, F, Br, acid and other chemical products for industries such as chemical industries, power industries or oil industries.

EXAMPLES

It may be appreciated that the examples herein are provided for the purposes of illustration only and are not meant to be limiting of the description and/or claims appended hereto.

Example 1

Figure 5:
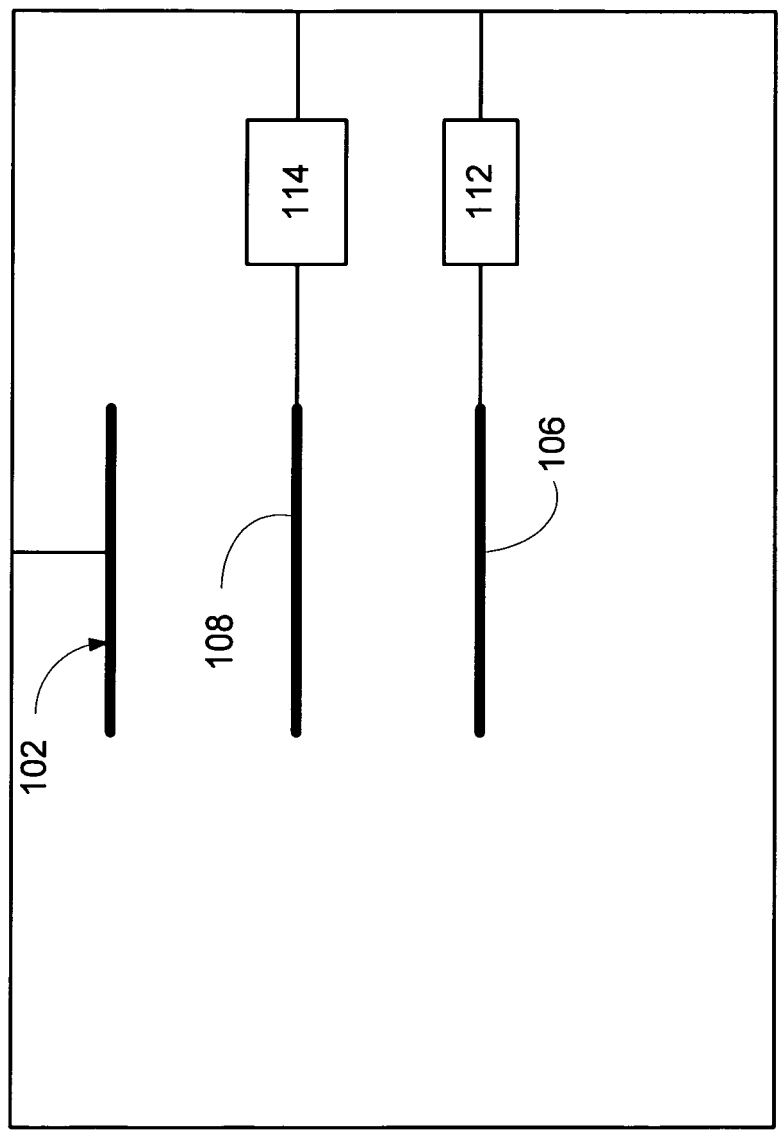
FIG. 5 is an example test system.
Figure 6:
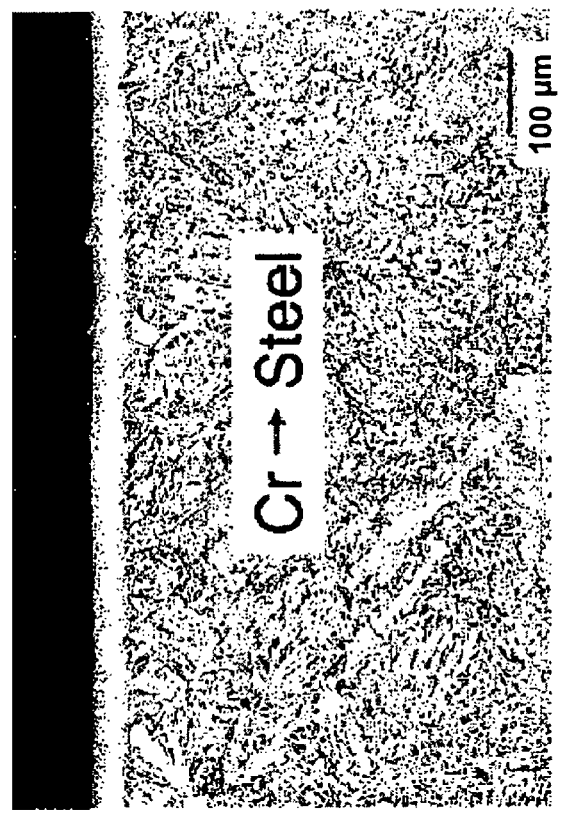
FIG. 6 is an example of a cross-section scanning electron microscope view of Cr treated 1018 steel.
Figure 7:
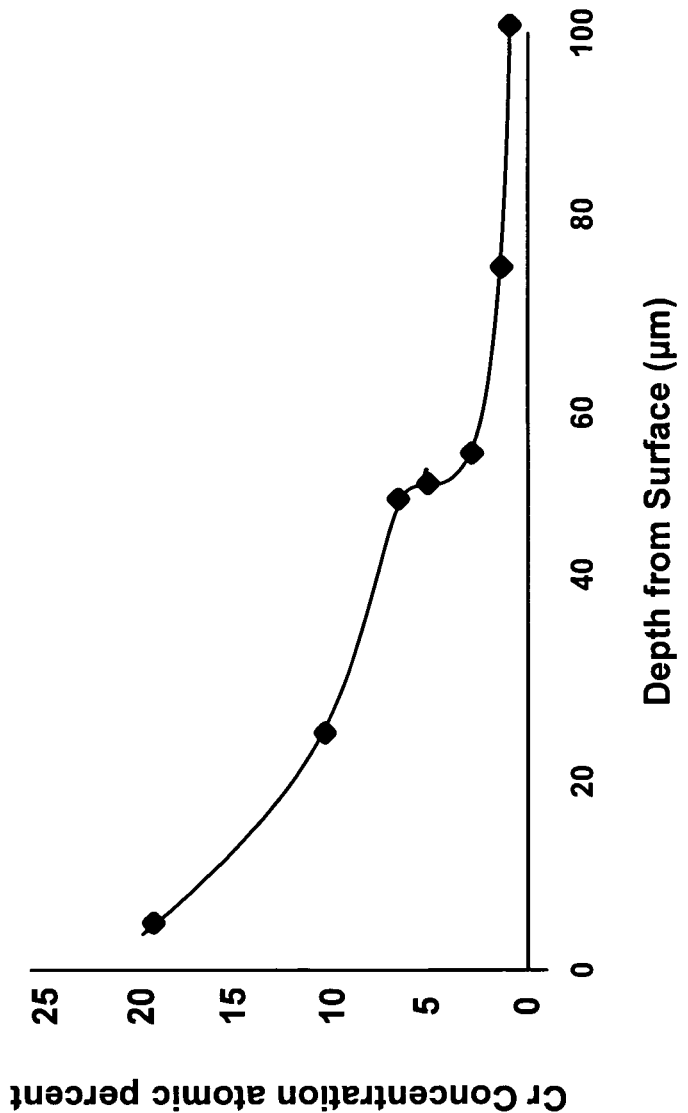
FIG. 7 is an example of energy dispersive spectroscopy readings for a sample of Cr treated 1018 steel.

As illustrated in FIG. 5, a source electrode providing a coating material, in this case Cr, 108 and an anode 102 are positioned within a vacuum chamber 102. A substrate, in this example 1018 steel, 106 was positioned on a graphite table. The Cr was sputtered onto the 1018 steel and diffused into the steel. FIG. 6 illustrates the coated steel and FIG. 7 illustrates energy dispersive spectroscopic data of the Cr depth profile into the steel. As seen in the figures, the Cr diffused into the steel to over 50 μm from the surface.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of sputtering a component, comprising:
   positioning a conductive substrate into a vacuum chamber, wherein said conductive substrate is tubular, is formed of a conductive polymer, a metal, or a conductive ceramic, and has a surface;
   inserting a source electrode including a source material into said conductive substrate, wherein said source material is selected from the group consisting of W, Mo, Nb, Ta or Re;
   evacuating said vacuum chamber and supplying a gas to said vacuum chamber to raise pressure in said to chamber to $1 \times 10^{-2}$ torr to $1 \times 10^2$ torr;
   applying a first bias voltage potential difference $\Delta V_{ac1}$ in the range of 100 to 1,000 V between said conductive substrate and said vacuum chamber with a first power supply connected to said conductive substrate that provides direct current and optionally increasing said first bias voltage potential difference to the range of 300 to 1,000 V after a given time period;
   applying a second bias voltage potential difference $\Delta V_{as1}$ between said source electrode and said vacuum chamber with a second power supply connected to the source electrode that provides an alternating current or direct current, in addition to applying said first bias voltage potential difference, wherein said second bias voltage potential difference $\Delta V_{as1}$ is less than said first bias voltage potential difference $\Delta V_{ac1}$ while sputtering said source material onto said conductive substrate; and
   regulating conductive substrate temperature, source electrode temperature, said first bias voltage potential difference $\Delta V_{ac1}$, said second bias voltage potential difference $\Delta V_{as1}$ and said pressure such that said source material diffuses into said substrate in the range of 0.1 μm to 250 μm from said surface of said conductive substrate.

2. The method of claim 1, wherein said tube is at least partially curved.

3. The method of claim 2, wherein said tube is at least partially curved between 1 and 270°.

4. The method of claim 1, wherein said tube has an internal diameter in the range of 1 mm to 4 m.

5. The method of claim 1, wherein said source electrode has an external diameter in the range of 0.1 mm to 3.95 m.

6. The method of claim 1, wherein said source material includes one or more transition metals.

7. The method of claim 1, wherein said gas is an inert gas.

8. The method of claim 1, wherein said gas is carbonaceous.

9. The method of claim 1, wherein said gas is nitrogen.

10. The method of claim 1, further comprising cooling said conductive substrate.

11. The method of claim 1, wherein said source material is coated onto said conductive substrate forming a layer of said source material on said surface.

12. The method of claim 11 wherein said source material is coated onto said conductive substrate at a thickness of up to and including 250 μm.

13. The method of claim 1, wherein said source material is coated onto said conductive substrate.

14. The method of claim 1, further comprising applying an alternating current to said source electrode.

15. A method of sputtering a component, comprising:
    positioning a conductive substrate into a vacuum chamber, wherein said conductive substrate is tubular, is formed of a conductive polymer, a metal, or a conductive ceramic, and has a surface;
    inserting a source electrode including a source material into said conductive substrate, wherein said source material is selected from the group consisting of W, Mo, Nb, Ta or Re;
    evacuating said vacuum chamber and supplying a gas to said vacuum chamber to raise pressure in said to chamber to $1 \times 10^{-2}$ torr to $1 \times 10^2$ torr;
    applying a first bias voltage potential difference $\Delta V_{ac1}$ in the range of 100 to 1,000 V between said conductive substrate and said vacuum chamber with a first power supply connected to the substrate that provides direct current and optionally increasing said first bias voltage potential difference to the range of 300 to 1,000 V after a given time period;
    applying a second bias voltage potential difference $\Delta V_{as1}$ between said source electrode and said vacuum chamber with a second power supply connected to the source electrode that provides an alternating current or direct current, in addition to applying said first bias voltage potential difference, wherein said second bias voltage potential difference $\Delta V_{as1}$ is less than said first bias voltage potential difference $\Delta V_{ac1}$ while sputtering said source material onto said conductive substrate;
    wherein said source material is coated onto said conductive substrate at a thickness of up to and including 250 μm; and
    regulating conductive substrate temperature, source electrode temperature, said first bias voltage potential difference $\Delta V_{ac1}$, said second bias voltage potential difference $\Delta V_{as1}$ and said pressure such that said source material diffuses into said substrate in the range of 0.1 μm to 250 μm from said surface of said conductive substrate.

16. A method of sputtering a component, comprising:
    positioning a source electrode including a source material into a vacuum chamber, wherein said source electrode is tubular and cooled and said source material is selected from the group consisting of W, Mo, Nb, Ta or Re;
    inserting a conductive substrate comprising a conductive polymer, a metal, or a conductive ceramic into said source electrode, wherein said conductive substrate has a surface;
    evacuating said vacuum chamber and supplying a gas to said vacuum chamber to raise pressure in said to chamber to $1 \times 10^{-2}$ torr to $1 \times 10^2$ torr;
    applying a first bias voltage potential difference $\Delta V_{ac1}$ in the range of 100 to 1,000 V between said conductive substrate and said vacuum chamber with a first power supply connected to said conductive substrate that provides direct current and optionally increasing said first bias voltage potential difference to the range of 300 to 1,000 V after a given time period;

applying a second bias voltage potential difference $\Delta V_{as1}$ between said source electrode and said vacuum chamber with a second power supply connected to the source electrode that provides an alternating current or direct current, in addition to applying said first bias voltage potential difference, wherein said second bias voltage potential difference $\Delta V_{as1}$ is less than said first bias voltage potential difference $\Delta V_{ac1}$ while sputtering said source material onto said conductive substrate; and regulating conductive substrate temperature, source electrode temperature, said first bias voltage potential difference $\Delta V_{ac1}$, said second bias voltage potential difference $\Delta V_{as1}$ and said pressure such that said source material diffuses into said substrate in the range of 0.1 µm to 250 µm from said surface of said conductive substrate.

17. The method of claim 14, wherein said alternating current provides resistance heating; and heat treating said substrate.

18. The method of claim 1, wherein said source material diffuses into said substrate at a concentration in the range of 1 to 30 atomic percent within 100 µm of said surface of said substrate.

* * * * *